United States Patent
Restrepo et al.

(10) Patent No.: US 7,936,543 B2
(45) Date of Patent: May 3, 2011

(54) SYSTEMS AND METHODS FOR TESTING GROUND FAULT DETECTION CIRCUITRY

(75) Inventors: Carlos Restrepo, Atlanta, GA (US); Hugh Kinsel, Sugar Hill, GA (US); Vaske Mikani, Atlanta, GA (US); Joselito Endozo, Dacula, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 338 days.

(21) Appl. No.: 12/055,640

(22) Filed: Mar. 26, 2008

(65) Prior Publication Data

US 2008/0239596 A1  Oct. 2, 2008

Related U.S. Application Data

(60) Provisional application No. 60/907,351, filed on Mar. 29, 2007.

(51) Int. Cl.
  *H02H 3/16*  (2006.01)
  *H02H 3/26*  (2006.01)
(52) U.S. Cl. .............................. 361/42; 361/45; 324/110

(58) Field of Classification Search .................... 361/42, 361/45; 324/110
See application file for complete search history.

(56) References Cited

U.S. PATENT DOCUMENTS

| | | | | |
|---|---|---|---|---|
| 3,786,356 | A * | 1/1974 | MacPhee | 361/45 |
| 5,177,657 | A * | 1/1993 | Baer et al. | 361/45 |
| 5,293,522 | A * | 3/1994 | Fello et al. | 335/18 |
| 5,459,630 | A * | 10/1995 | MacKenzie et al. | 361/45 |
| 5,642,052 | A * | 6/1997 | Earle | 324/556 |
| 6,437,955 | B1 * | 8/2002 | Duffy et al. | 361/45 |
| 6,954,125 | B2 * | 10/2005 | Wu et al. | 335/18 |

* cited by examiner

*Primary Examiner* — Stephen W Jackson
*Assistant Examiner* — Zeev Kitov
(74) *Attorney, Agent, or Firm* — Jose R. de la Rosa

(57) ABSTRACT

A circuit tests the health of a ground-neutral transformer within a ground fault circuit interrupter. This test can include testing both the ground-to-neutral detection circuitry and the differential current detection circuitry. The test circuit provides a conductive path through the respective cores of a differential transformer and the ground-neutral transformer of the GFCI device. A closed loop induces current from the differential transformer, which creates a current imbalance through the differential transformer. In a properly working device, the circuit breaker will trip, confirming the health of the ground-neutral transformer portion of the GFCI.

19 Claims, 4 Drawing Sheets

SYSTEMS AND METHODS FOR TESTING GROUND FAULT DETECTION CIRCUITRY

CROSS REFERENCE TO RELATED APPLICATIONS

This application claims priority to Provisional Application Ser. No. 60/907,351, entitled "Systems and Methods for Testing Ground Fault Detection Circuitry," filed Mar. 29, 2007.

TECHNICAL FIELD

The present disclosure relates generally to fault detection in electrical circuits and, more particularly, to systems and methods for testing ground fault detection functionality in electrical protection systems.

BACKGROUND

A ground fault circuit breaker is an electrical protection device that disconnects a circuit when current leakage is detected. Leakage occurs when current flowing through a line, or "hot," conductor from a source to a load is diverted to ground without returning to the source. This leakage may result from an accidental short circuit, perhaps from a defective load attached to the line. If a person touches the load, the leakage current may pass that person's body to ground, leading to an electrical shock. Consequently, ground fault circuit breakers ("GFCIs") act as safety devices and are designed to detect line-to-ground shorts and to disconnect the distribution circuit.

GFCIs also need to act quickly. While a typical circuit breaker interrupts the circuit at 20 amperes, it takes only about 100 milliamperes to electrocute a person. Therefore, for added safety, GFCIs must be able to detect current flow between a line and ground at current levels as little as 5 milliamperes and trip a breaker at the receptacle or at the breaker panel to remove the shock hazard. GFCIs are generally required for receptacles in bathrooms and other areas exposed to water in an effort to prevent deadly ground fault situations from occurring.

In two-line systems, GFCIs typically detect current leakage by comparing the current flowing in the line and returning in the neutral. A difference in current levels implies that some current has leaked from the circuit to ground and that a fault exists. GFCIs typically use a differential transformer to detect a difference in the line and neutral current levels. The differential transformer is often a toroidal core that has as its primary windings the line and neutral conductors of the distribution circuit being protected, which are encircled by the core. Its secondary windings are wrapped around the core.

During normal conditions, the current flowing in one direction through the line conductor will return in the opposite direction through the neutral conductor. This balance produces a net current flow of zero through the differential transformer, and the multi-turn winding provides no output.

If a fault exists, current leaks from the line conductor to ground, and the current flowing back through the line and neutral currents will not be equal through the differential transformer. This current imbalance will produce uncancelled flux in the differential transformer's core, resulting in an output from the multi-turn secondary winding. Detection circuitry identifies the output and opens the circuit breaker contacts.

A GFCI device must account for decreased sensitivity that the differential transformer may have if a ground-to-neutral fault also exists. A wiring error at the breaker or load may create a ground-to-neutral short or path. A ground-to-neutral path in itself does not create a shock hazard. However, with such a condition, when a line-to-ground fault occurs, possibly though a person's body, a portion of the current may return to the neutral conductor via the ground-to-neutral path. Another portion of the leaked current may return to the source via ground. To the extent a portion of the leaked current returns to the neutral conductor, it will escape detection by the differential transformer. In short, the current differential detected by the transformer will be lower than the actual current leaked to ground. This offset may cause the transformer to not detect a hazardous ground fault and, at the least, will cause the transformer to be less sensitive to ground faults than intended.

An example may help explain the problem. If a line-to-ground short exists, it may cause 6 milliamperes to pass from the line conductor through a human body. If 5 of the 6 milliamperes return to (or leak back onto) the neutral conductor via a ground-to-neutral fault (perhaps due to a ground wiring error), the differential transformer will only detect 1 milliamperes in leakage current. This amount may not be sufficient to trip the circuit breaker, even though the 6 milliampere leakage is hazardous.

To protect against this loss of sensitivity, GFCIs often include a second transformer, referred to as a ground-neutral transformer. The ground-neutral transformer typically comprises a solenoidal or toroidal core that encircles at least the neutral conductor and has a multi-turn winding wound thereon. Preferably, the ground-neutral transformer encircles the line conductor as well. An oscillator is generally coupled to the coils of the ground-neutral transformer to energize the coils. A common type of ground-neutral transformer is called a dormant oscillator. The ground-neutral transformer helps detect ground-to-neutral shorts and compensates for the loss of sensitivity that may arise with the differential transformer.

Most GFCIs have a "test" button for verifying the heath of the device. Current test methods generally create a small current imbalance by passing current through the core of the differential transformer. For example, pressing the test button may cause the 120 volt supply to be drawn across a 14.75 K resistor along a test wire that passes through the differential transformer. In this example, a current of 8.2 mA (milliamperes), which is greater than the 5 mA leakage current detection requirement for GFCI circuits, passes through the differential transformer. The differential transformer and detection circuitry in a correctly working device would detect the test current as an imbalance, and cause the circuit to trip. The tester interprets this result as meaning the circuit breaker device is working safely and correctly. If the circuit breaker does not trip, the tester may assume the circuit has a problem that may be dangerous and require a specialist's attention. Some GFCI devices include a reset button for resetting the breaker after it has tripped.

Unfortunately, existing GFCIs (and other protection devices that contain GFCIs, such as arc-fault circuit interrupters) only test the differential transformer portion of the circuit. No method appears to exist for testing the ground-neutral transformer. One explanation is that it has been believed that such testing may require passing a current along the ground connection, which could create a hazardous situation.

Because the ground-neutral transformer is currently not tested, a GFCI (or other ground fault circuit breaker) device may test successfully even though the circuitry for detecting ground-to-neutral faults is inoperative, giving the tester a false sense of security. A potentially dangerous (or even lethal) ground-to-neutral fault condition may exist, but there is currently no way for the tester to know.

Accordingly, in an effort to reduce the negative effects of undetected ground-to-neutral circuit faults and better facilitate testing the circuitry used for detecting these faults, systems and methods for testing ground fault detection circuitry may be required.

SUMMARY

Processes and methods consistent with the disclosed embodiments are directed toward a ground fault circuit breaker that includes circuitry for testing the ground-to-neutral fault detection capability of the ground-neutral transformer. Alternatively, and/or additionally, the disclosed embodiments may be directed toward a combination AFCI/GFCI device, or a GFCI device that provides one or more of the following: fault detection, mitigation, and reporting of both or either ground faults and arc faults for an electrical system.

In accordance with one aspect of the present disclosure, an embodiment may include a circuit breaker for use with a circuit having at least one line conductor and a neutral conductor. The circuit breaker may include a differential transformer having a first magnetic core, and the differential transformer may be coupled to detection circuitry. The hot conductor and neutral conductor may both run through the first magnetic core. The circuit breaker may also include a ground-neutral transformer having a second magnetic core, and at least the neutral conductor may run through the second magnetic core. In addition, an oscillator may be coupled to the ground-neutral transformer and provide current to the ground-neutral transformer at an oscillation frequency. The embodiment may contain a test circuit that simulates a neutral-to-ground connection, comprising: a test conductor running through the first magnetic core and the second magnetic core, the test conductor being coupled to the neutral conductor; and a switch coupled to the test conductor. Closing the switch may close the test circuit and create a path along the test conductor for inducing current from the ground-neutral transformer.

In another embodiment, the test circuit includes at least one resistive element and at least one capacitor element, the resistive element and the capacitor substantially matching the inductive capability of the test conductor with the oscillation frequency of the ground-neutral transformer.

Yet another embodiment includes a method for providing a testing circuit for a ground-to-neutral fault detection circuitry in a circuit breaker device that comprises a ground-to-neutral transformer having a first magnetic core, the ground-to-neutral transformer being coupled to an oscillator, and a differential transformer having a second magnetic core, the differential transformer coupled to detection circuitry, the method comprising: providing a conductive path through the first magnetic core and the second magnetic core; coupling the conductive path to a neutral line monitored by the circuit breaker; and providing a switch capable of closing a circuit loop along the conductive path.

Still another embodiment may include a method with the step of tuning the circuit loop to induct current based on an oscillation frequency of the oscillator by providing at least one resistive element and at least one capacitor element along the circuit loop, and matching the at least one resistive element and capacitor element with the oscillation frequency of the ground-fault transformer.

In accordance with another aspect of the present disclosure, a method of testing the ground-neutral transformer in one embodiment may not require any quiescent current (i.e., ground current) in order to perform the test. In that embodiment, the test circuit does not make any connection with ground. As a result, the circuit loop can be floating. However, in another embodiment, the test circuit does make contact with ground.

It is important to note that although exemplary GFCI devices are referred to herein, a GFCI device, as used herein, can include any kind of ground fault circuit breaker, and may include AFCI or some other fault protection element. The terms "GFCI" and "circuit breaker" are used synonymously herein.

Additional objects and advantages of the embodiments will be set forth in part in the description which follows, and in part will be obvious from the description, or may be learned by practice of the embodiments. The objects and advantages of the embodiments will be realized and attained by means of the elements and combinations particularly pointed out in the appended claims.

It is to be understood that both the foregoing general description and the following detailed description are exemplary and explanatory only and are not restrictive of the embodiments, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

Figure 1:
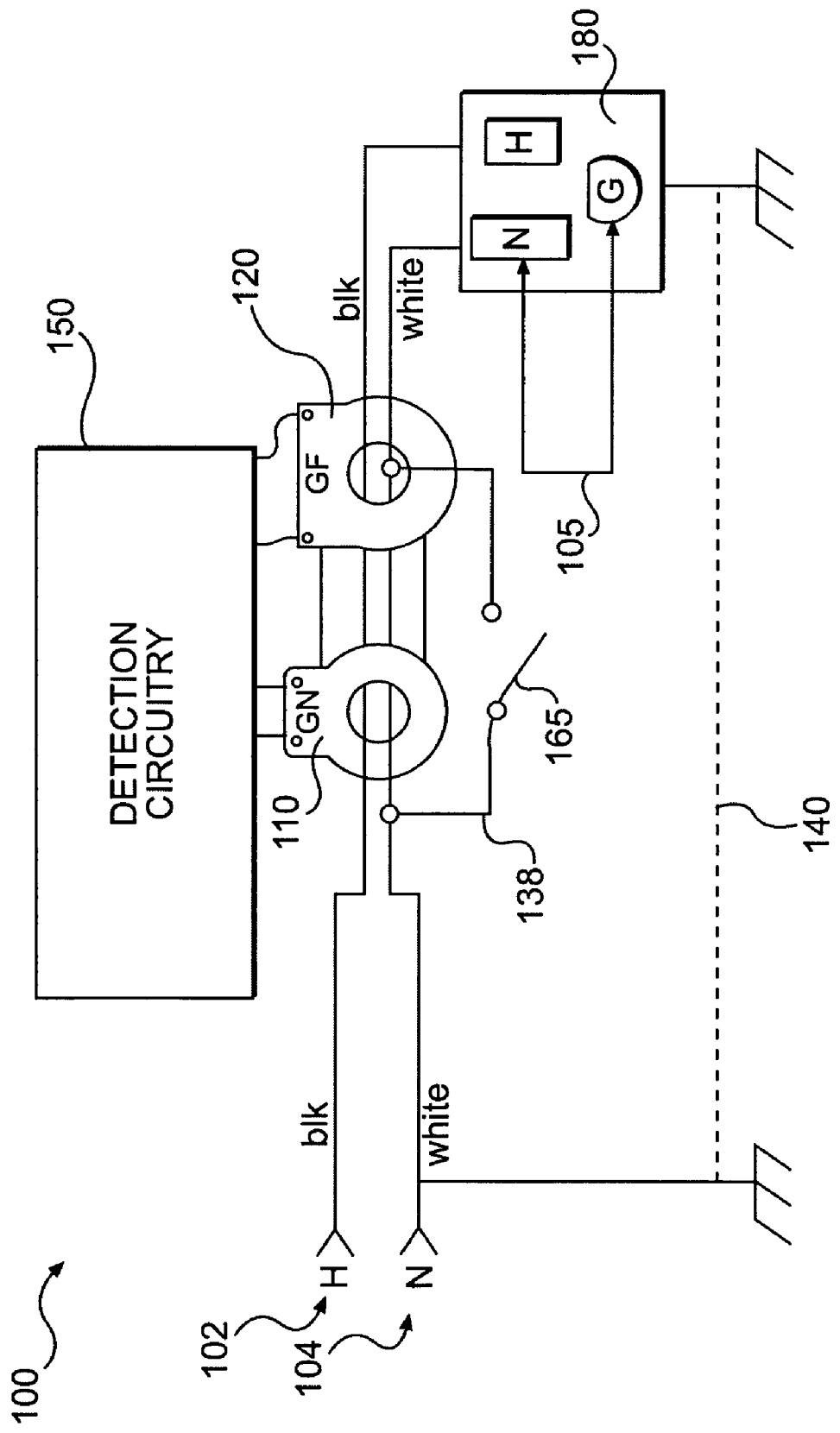
FIG. 1 is a simplified overview diagram of an exemplary ground fault circuit interrupter (GFCI) device 100 used in accordance with certain exemplary embodiments disclosed herein.

FIG. 1 provides a diagram of an exemplary ground fault circuit interrupter (GFCI) device 100 (also called a ground fault circuit breaker) used in accordance with one embodiment of the present invention. This device may be adapted for use in any residential and/or commercial power system environment, and may be configured to detect ground-to-neutral faults that may be present on a power circuit associated with a power system. Device 100 may also be configured to detect arc faults.

As illustrated in FIG. 1, device 100 may include traditional GFCI circuitry, such as a ground-neutral transformer 110 and differential transformer 120. These transformers 110 and 120 may be coupled to detection circuitry 150 to sense a difference in the hot 102 and neutral 104 conductor currents and/or a ground-to-neutral fault 105. For example, an imbalance in current on lines 102 and 104 may produce a current in the coils of differential transformer 120, which is detected by differential transformer 120.

A ground-to-neutral fault 105 may create a closed loop along the neutral conductor 104 and ground 140. This closed loop may induce current from the ground-neutral transformer 110, creating a current imbalance that is detected by the differential transformer 120. The detection circuitry then trips the circuit breaker (not shown) if the imbalance exceeds a threshold.

However, unlike existing GFCI devices, an embodiment consistent with FIG. 1 may also include a test circuit 138 for emulating a ground-neutral fault and testing the ground-neutral detection circuitry. A switch 165, such as a push-to-test (PTT) switch or some other switch type, can activate the test circuit. The switch can be controlled manually and/or automatically, depending on the embodiment. When the switch 165 is closed, a loop is formed through the core of the ground-neutral transformer along the neutral path that simulates a ground-to-neutral fault. The closed loop of test circuit 138 may induce current from ground-neutral transformer 110 along the closed conductive test path if the ground-to-neutral fault detection circuitry is working properly. The induced current may create a current imbalance between the hot and neutral conductors that is detected by the differential transformer 110. If this imbalance is great enough, it will be detected by properly-working detection circuitry. In one embodiment, this detected imbalance causes the circuit breaker to trip. Alternatively, an embodiment may test the ground-neutral fault detection circuitry without causing the circuit breaker to trip. As explained herein, the test circuit may be more complex than the example test circuit 138 provided in FIG. 1.

Test circuits and methods consistent with embodiments disclosed herein provide additional safety and peace of mind to consumers by more thoroughly testing the circuit breaking capabilities of devices, such as GFCI devices. In addition, the low cost of implementing these circuits and methods make them very attractive to manufacturers of related devices.

Figure 2:
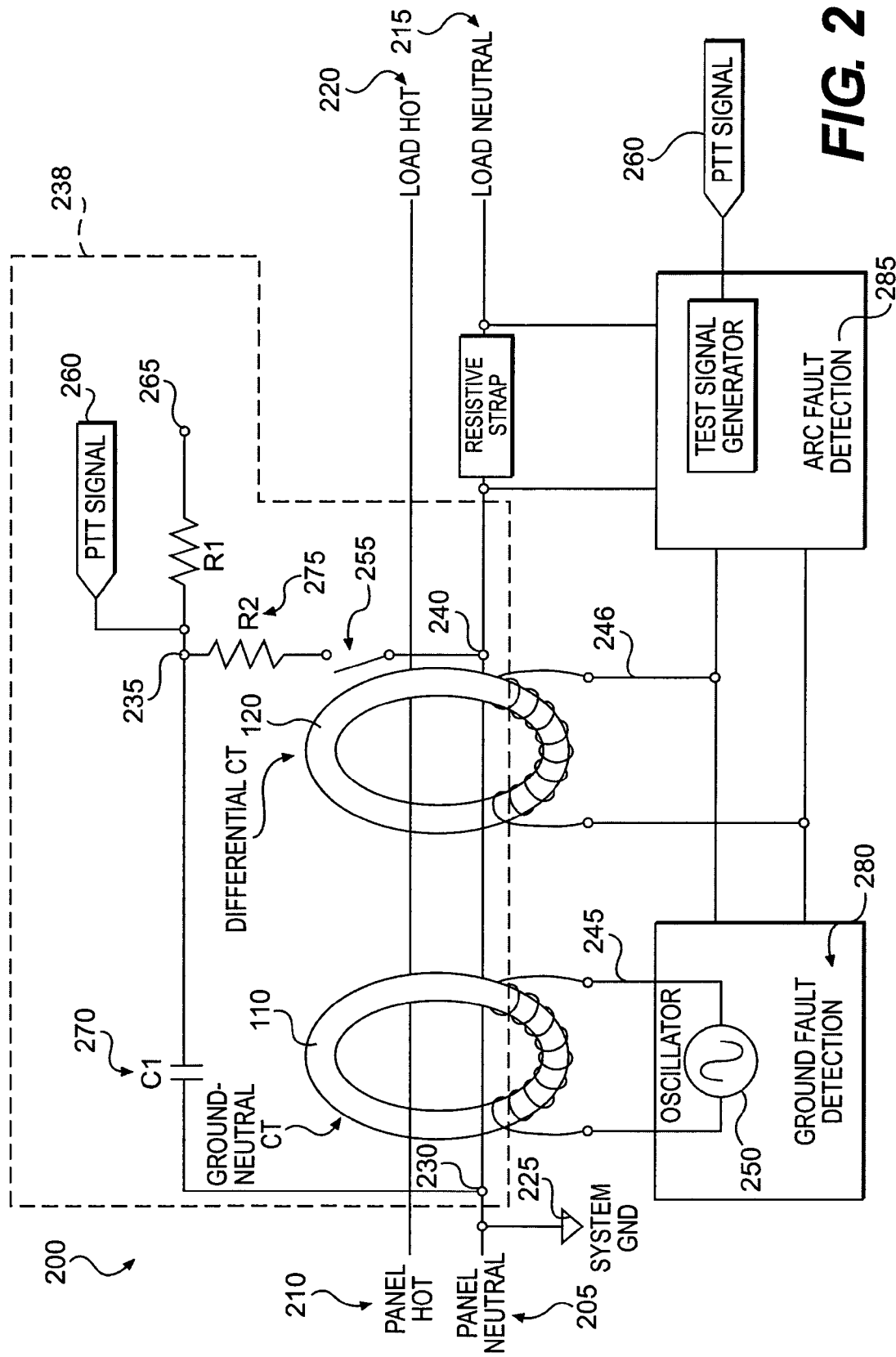
FIG. 2 is a diagram of an exemplary GFCI device 200 used in accordance with certain exemplary embodiments disclosed herein.

FIG. 2 is a diagram of an exemplary GFCI device 200 used in accordance with an embodiment of the current invention. Turning now to FIG. 2, in an embodiment, the coils of ground-neutral transformer 110 may be coupled to oscillator 250, for example, at 245. In some embodiments, the oscillator may be part of the ground fault detection circuitry 280. In addition, the oscillator 250 may be a dormant oscillator, providing an alternating current to ground-neutral transformer 110 without requiring quiescent power. However, current is preferably only induced from the ground-neutral transformer when a closed loop exists that includes a conductive path through the ground-neutral transformer 110 (in this embodiment, along the neutral conductor). Such a closed loop is created, for example, when a ground-to-neutral fault exists. In some embodiments, the oscillator 250 powers the ground-neutral transformer 110, which induces current onto the neutral conductor to compensate for current from the ground-to-neutral fault that has leaked back onto the neutral conductor 205. In some cases, without the compensation provided by the oscillator 280 and the ground-neutral transformer 110, the ground-to-neutral fault would go undetected by the differential transformer 120, as previously described.

The ground-fault transformer 110 may comprise a toroid or solenoid for transforming the oscillated signal and inducing current onto the test circuit 238. A toroidal structure may better confine the magnetic effects of the transformer 110 to the test circuit 238, when compared to a solenoid in some embodiments. A toroidal transformer can comprise uniform windings that allow for more predictable operation in some embodiments. Similarly, the differential transformer 120 may comprise a toroid or solenoid for detecting current imbalances between the neutral 205 and hot 210 conductors. In an alternate embodiment, one transformer can serve as both the ground-neutral transformer 110 and the differential transformer 120.

An embodiment, such as the example in FIG. 2, can include a test circuit 238 with conductive path couplings at points 230, 235, and 240. However, the test circuit 238 can be arranged in different ways, depending on the embodiment. In general, the test circuit 238 may replicate a ground-to-neutral fault condition in order to test the ground-to-neutral fault detection capabilities of the GFCI circuit 200. In some embodiments, other functionality, such as arc fault detection circuitry 285, is also tested.

The test circuit can be activated by closing switch 255. For example, the system might periodically test one or more components of the GFCI circuit by supplying a test signal to the respective test circuit and performing a test. In other embodiments, the PTT switch is physically thrown by a human. For example, pressing a button on a GFCI outlet or receptacle may close the PTT switch 255. In other embodiments, PTT switch 255 may be electronically closed, such as by a circuit breaker control device that runs periodic tests on GFCI circuits under its control.

Continuing with FIG. 2, when PTT switch 255 is closed, the test circuit 238 tests the ground-to-neutral fault detection capabilities of the GFCI device, which may include a properly-functioning ground-neutral transformer 110, differential transformer 120, and oscillator 250, among other ground fault detection circuitry 280. In FIG. 2, closing the PTT switch 255 creates a closed circuit loop along 230, 235, and 240. The loop is also referred to herein as a "test path" or "test conductor." In this embodiment, because the loop runs through the core of ground-neutral transformer 110, the loop is capable of inducing current from the ground-neutral transformer 110. In a properly working GFCI device, this results in a current imbalance between the neutral 205 and hot 210 conductors. The imbalance is detected by the differential transformer 120, and produces a current or signal at 246, which is interpreted by detection circuitry, for example, at 280 and/or 285. If the difference is above a threshold (e.g., 5 milliamperes), the circuit breaker may be thrown. In that embodiment, when the circuit is broken, the test may be deemed successful.

In another embodiment, the detection circuitry 280 and/or 285 does not throw the circuit breaker during a test. First, even if an imbalance is created between the neutral 104 and hot 102 conductors, the detection circuitry 280 and/or 285 can distinguish that the imbalance is caused by a test, and not trip the circuit breaker. For example, the ground fault detection circuitry 280 may override the logic to trip the circuit breaker if the test signal is present, even if the current imbalance would ordinarily trip the circuit breaker. In another aspect, the detection circuitry trips the circuit breaker even in the presence of the test signal if the imbalance exceeds a predetermined threshold. The excessive imbalance would generally indicate that an actual fault has occurred at the same time the test is performed. In such a situation, the fault detection circuitry 280 and 285 can cause the circuit breaker to trip even though the test signal is active.

Alternatively, an embodiment can test the ground-neutral fault detection circuitry without tripping the circuit breaker if the test path (of test circuit 238) does not run through the core of the differential transformer 120. Because the conductive path of the test circuit does not run through the differential transformer 120, that transformer does not detect a current imbalance as a result of the test. Instead, the test circuit 238 conductive path runs through the ground-neutral transformer 110 core and some other mechanism or circuitry besides the differential transformer 120 for detecting whether current is induced along the test circuit (e.g., along the conductive path). The success or failure of the test is then effectuated by means other than tripping the circuit breaker.

In embodiments that do not throw the circuit breaker during a test of the ground-neutral fault detection circuitry, a user or system can test the detection circuitry without powering down a load. For example, if a circuit powers a server, breaking the circuit during the test will cause the server to lose power, which in turn causes undesirable effects for users of the server. If the test is initiated on a scheduled basis by some component of a power system, it can be desirable for the automated test to not interrupt the supply of power to the load.

In addition (or in the alternative) to throwing the circuit breaker, the device may indicate the success or failure of a test of the ground-fault detection circuitry in various other ways. For example, a light, such as a light emitting diode (LED), can indicate the success of the test to the user. In one aspect, the light turns off when the test is successful. In another aspect, the light turns on or blinks to indicate a successful test. The light can be located on a wall receptacle, or alternatively, can be part of a larger circuit breaker system or control panel. Alternatively, a signal, such as PTT signal 260, may provide electronic notification of a successful test to some other part of a circuit breaker system. Other methods, such as auditory notification, are also available.

In one embodiment, oscillator 250 is a dormant oscillator or a non-persistent oscillator. While the oscillator 250 may or may not consume current during regular operation of the circuit, closing the PTT switch 255 may provide additional current to oscillator 250. In this aspect, oscillator 250 only pulls maximum current when PTT 255 is closed and a fault detection test is being performed. A low transition on the PTT signal may start the oscillations of the ground-neutral transformer 110 in this example. A microprocessor or some other logic may also be incorporated to start the oscillation of oscillator 250. In contrast, if oscillator 250 is a persistent oscillator, the circuit may supply current to the oscillator 250 at a constant level, irrespective of whether PTT 255 is pressed.

In some embodiments, a resistive element 275 and/or capacitive element 270 are included in the test circuit 238. These elements can be used to "tune" the inductance level of the test circuit 238. This tuning may also be done in conjunction with VCC 265. The test circuit should be tuned to pull enough current across the neutral conductor (or some other conductor passing through the transformer cores) to cause properly-functioning circuitry to trip the circuit breaker (or power-down the circuit through some other method). In addition, elements 270 and 275 should be selected to tune the inductance of the test circuit away from 60 Hertz, because 60 Hertz is the frequency of alternating current in the typical United States residential or commercial establishment. If the test circuit is not tuned away from 60 Hertz, the test circuit may induce current from the alternating current on the hot conductor 210. In one embodiment, the test circuit is tuned to a frequency between about 1 kHz and 20 kHz. Such tuning can be accomplished by numerous combinations of resistive and capacitive elements, as will be understood by one of ordinary skill in the art.

Figure 3:
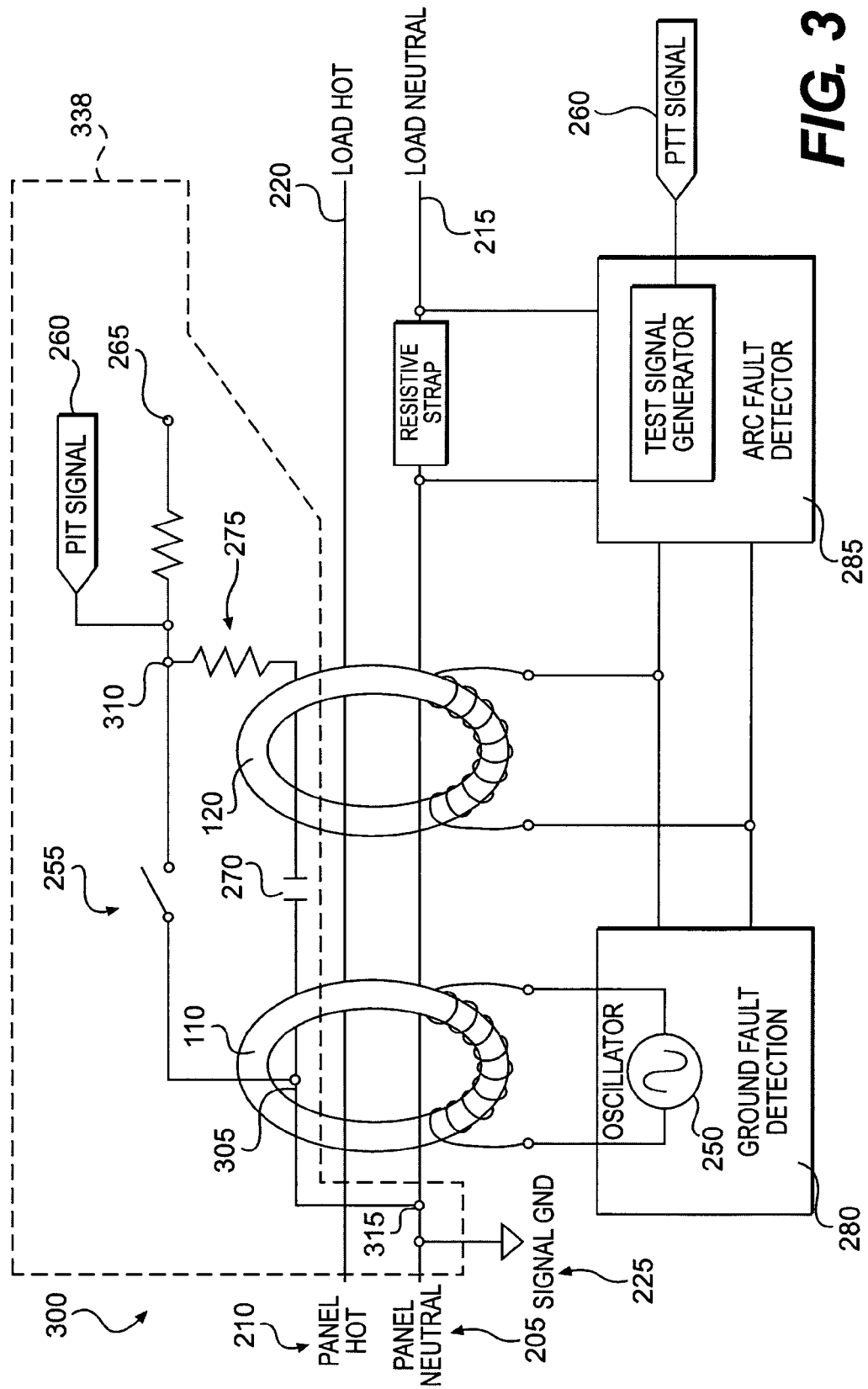
FIG. 3 is a diagram of an alternate exemplary GFCI device 300 used in accordance with certain exemplary embodiments disclosed herein.

Turning now to FIG. 3, an alternate exemplary embodiment of a GFCI device 300 is shown. The test circuit 338 is configured differently than the test circuit 238 of FIG. 2. In FIG. 3, test circuit 338 is coupled with the neutral conductor 205 at 315. As a result, a third conductive path extends through the core of transformers 110 and 120. Capacitive element(s) 270, resistive element(s) 275, and PTT switch 255 are rearranged along the circuit 338. Various configurations of these elements are possible in different test circuit embodiments for different inductance tuning and/or spatial requirements.

In the example of FIG. 3, when the switch 255 is closed, current may be drawn around the test circuit 338 between points 305 and 310 via induction. The current may be induced by ground-neutral transformer 110 because the conductive path of the test circuit 338 between points 305 and 310 runs through the core of the ground-neutral transformer 110. If the GFCI device is working correctly, the current flow between 305 and 310 creates a current imbalance within the core of the differential transformer 120, because the path between 305 and 310 runs through the core of the differential transformer 120. The imbalance may be interpreted by detection circuitry, such as 280 or 285, and, if the GFCI device is working correctly, a successful test will be indicated to the user or system. In one embodiment, success can be indicated when the detection circuitry powers down the circuit (for example, by throwing the circuit breaker). As previously discussed, alternate or additional indicia are also possible.

As with the example in FIG. 2, the test circuit 338 in FIG. 3 should be tuned to induce enough current through differential transformer 120 to cause the circuit breaker to be tripped. Tuning the circuit may be achieved by choosing one or more capacitive elements 270, one or more resistive elements 275, and/or supplying a digital voltage VCC 265 to the circuit 338.

Figure 4:
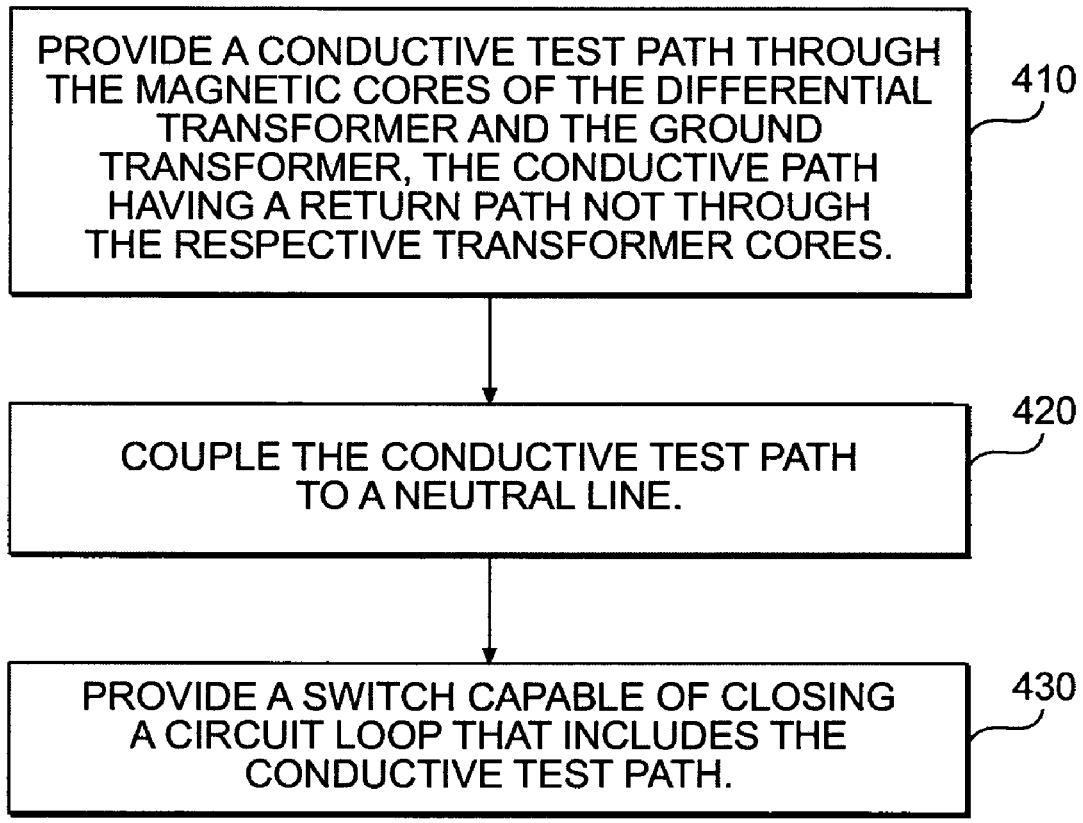
FIG. 4 is an exemplary flow chart that includes steps for providing a test circuit for a ground-to-neutral transformer in a circuit breaker.

FIG. 4 is an exemplary flow chart that includes steps for providing a test circuit for a ground-neutral transformer in a circuit breaker. Turning now to FIG. 4, step 410 may require providing a conductive test path through the magnetic cores of the differential transformer 120 and the ground transformer 110. Additionally, the conductive test path may include a return path that is not through the respective magnetic cores of transformers 110 and 120. In some embodiments, the path will include one or more resistive elements 275 and/or one or more capacitive elements 270.

Step 420 may include coupling the conductive test path to a neutral line 205. In some embodiments, such as in FIG. 2, this coupling may occur at multiple points along the neutral conductor 205, such as at 230 and 240. In other embodiments, the conductive path may be coupled to the neutral conductor 205 at only one point, such as point 315 in FIG. 3. In an embodiment, in order to simulate a ground-to-neutral fault, some contact may be necessary between the conductive test path and the neutral conductor 205.

Step 430 may require providing a switch capable of closing a circuit loop that includes the conductive path. In some embodiments, the test circuitry is not active until this switch is closed. The switch 430 may be closed by human interaction, such as by pushing a test button on an electrical receptacle, or may be controlled electronically, such as by a circuit breaker control system.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A ground fault circuit breaker for use with a circuit having at least one line conductor and a neutral conductor, the circuit breaker comprising:
   a differential transformer having a first magnetic core, the differential transformer being coupled to detection circuitry, the hot conductor and neutral conductor both running through the first magnetic core;
   a ground-neutral transformer having a second magnetic core, at least the neutral conductor running through the second magnetic core;

an oscillator coupled to the ground-neutral transformer, the oscillator providing current to the ground-neutral transformer at an oscillation frequency; and a test circuit that simulates a ground-to-neutral connection, comprising:

a test conductor, a portion of which runs through the first magnetic core, the test conductor being electrically connected to the neutral conductor; and a switch coupled to the test conductor, wherein closing the switch closes the test circuit and creates a test path loop along the test conductor for coupling current induced in the ground-neutral transformer to the differential transformer, the coupled current causing the detection circuitry to indicate a successful test.

2. The circuit breaker of claim 1, wherein the closed test circuit includes at least one resistive element and at least one capacitor element, the resistive element and the capacitor substantially matching an inductive capability of the test conductor with the oscillation frequency of the ground-neutral transformer.

3. The circuit breaker of claim 1, wherein the test circuit is tuned to an oscillation frequency between about 1 kHz to about 20 kHz.

4. The circuit breaker of claim 1, wherein the test conductor runs through the second magnetic core.

5. The circuit breaker of claim 1, wherein the portion of the test conductor that runs through the first magnetic core comprises the neutral conductor.

6. The circuit breaker of claim 1, wherein the induced current causes the detection circuitry to trip the circuit breaker.

7. The circuit breaker of claim 6, wherein the detection circuitry indicates a successful test by tripping the circuit breaker.

8. A ground fault circuit interrupter device comprising:

a differential transformer having a first magnetic core and being coupled to detection circuitry, the line conductor and neutral conductor both running through the first magnetic core;

a ground-neutral transformer having a second magnetic core, a least the neutral conductor running through the second magnetic core;

an oscillator coupled to the ground-neutral transformer, the oscillator providing current to the ground-neutral transformer at an oscillation frequency; and a test circuit, comprising:

a circuit loop with a conductive test path running through the respective cores of both the differential transformer and the ground-neutral transformer, the circuit loop configured to couple current induced in the ground-neutral transformer to the differential transformer, the coupled current causing the detection circuitry to indicate a successful test when the loop is closed, the induced current being great enough to cause the detection circuitry to trip the circuit breaker, the test circuit being electrically connected to the neutral conductor; and a switch coupled along the circuit loop, capable of closing the circuit loop.

9. The ground fault circuit interrupter device of claim 8, wherein the conductive test path includes the neutral conductor.

10. The ground fault circuit interrupter device of claim 8, wherein the ground-neutral transformer is a toroid.

11. The ground fault circuit interrupter device of claim 8, wherein the detection circuitry receives a test signal and does not trip the circuit breaker while the test signal is present.

12. The ground fault circuit interrupter device of claim 8, wherein the detection circuitry receives a test signal and trips the circuit breaker in the presence of the test signal if the induced current meets a threshold, the threshold being set such that the amount of induced current in the circuit loop when the loop is dosed is sufficient for tripping.

13. The ground fault circuit interrupter device of claim 8, wherein the test circuit is tuned to an oscillation frequency between about 1 kHz to about 20 kHz.

14. A method for providing a test circuit for testing ground-to-neutral fault detection circuitry in a circuit breaker device, the circuit breaker device comprising a ground-neutral transformer having a first magnetic core, the ground-neutral transformer being coupled to an oscillator, and a differential transformer having a second magnetic core, the differential transformer coupled to detection circuitry, the method steps comprising:

providing a conductive test path through the first magnetic core and the second magnetic core, the test path being capable of coupling current induced in the ground-neutral transformer to the differential transformer when a dosed circuit is formed along the test path, the coupled current causing the detection circuitry to indicate a successful test;

electrically connecting the test path to a neutral conductor monitored by the circuit breaker; and coupling a switch to the test pat he switch being capable of dosing the circuit formed along the test path.

15. The method of claim 14, the method steps further comprising indicating to a user whether the ground-to-neutral fault detection circuitry is operational when the switch closes the circuit formed along the test path.

16. The method of claim 15, wherein indicating the ground-to-neutral fault detection circuitry is operational includes throwing the circuit breaker.

17. The method of claim 15, wherein a light indicates whether the ground-to-neutral fault detection circuitry is operational.

18. The method of claim 14, wherein the test path is tuned to induct current based on an oscillation frequency of the oscillator by providing at least one resistive element and at least one capacitive element along the circuit formed along the test path, and matching the at least one resistive element and capacitor element with the oscillation frequency of the ground-fault transformer.

19. A ground fault circuit breaker for use with a circuit having at least one line conductor and a neutral conductor, the circuit breaker comprising:

a differential transformer having a first magnetic core, the differential transformer being coupled to detection circuitry, the hot conductor and neutral conductor both running through the first magnetic core;

a ground-neutral transformer having a second magnetic core, at least the neutral conductor running through the second magnetic core;

an oscillator coupled to the ground-neutral transformer, the oscillator providing current to the ground-neutral transformer at an oscillation frequency; and a test circuit that simulates a ground-to-neutral connection, comprising:

a test conductor, a portion of which runs through the first magnetic core, the test conductor being electrically connected to the neutral conductor and not connected to the hot conductor; and a switch coupled to the test conductor, wherein closing the switch doses the test circuit and creates a path along the test conductor for inducing current from the ground-neutral transformer, the induced current causing the detection circuitry to indicate a successful test.

* * * * *